United States Patent
Altizer et al.

(10) Patent No.: US 6,925,114 B2
(45) Date of Patent: Aug. 2, 2005

(54) WEAK SIGNAL PROCESSING BASED ON IMPULSE NOISE BLANKING

(75) Inventors: Daniel T Altizer, Kokomo, IN (US); Jeff N Tran, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 456 days.

(21) Appl. No.: 10/263,017

(22) Filed: Oct. 2, 2002

(65) Prior Publication Data

US 2004/0067743 A1 Apr. 8, 2004

(51) Int. Cl.[7] .............................. H04B 1/10; H04B 17/00
(52) U.S. Cl. ...................... 375/227; 455/223; 455/295; 455/63.1; 455/67.13; 375/227; 375/285; 381/13
(58) Field of Search ...................... 455/63.1, 67.13, 455/222, 223, 295–296, 310, 283; 375/227, 284, 285; 381/13

(56) References Cited

U.S. PATENT DOCUMENTS

| | | | |
|---|---|---|---|
| 4,975,953 A | | 12/1990 | Kennedy et al. |
| 5,261,004 A | * | 11/1993 | Manlove et al. ............... 381/15 |
| 5,463,662 A | * | 10/1995 | Sutterlin et al. ............. 375/351 |
| 5,890,059 A | * | 3/1999 | Shoemaker et al. ......... 455/297 |
| 6,292,654 B1 | * | 9/2001 | Hessel et al. ................ 455/223 |
| 6,294,784 B1 | | 9/2001 | Schubring et al. |
| 6,295,324 B1 | * | 9/2001 | Whikehart ................... 375/308 |
| 6,347,146 B1 | * | 2/2002 | Short et al. .................... 381/15 |
| 2001/0016475 A1 | * | 8/2001 | Tsujishita et al. ............ 455/222 |
| 2003/0043925 A1 | * | 3/2003 | Stopler et al. .............. 375/254 |

* cited by examiner

Primary Examiner—Simon Nguyen
(74) Attorney, Agent, or Firm—Stefan V. Chmielewski

(57) ABSTRACT

An improved noise reduction system (20) is provided for a radio frequency audio processor having one or more weak signal processing components for generating one or more corresponding control values (36a, 36b) for controlling characteristics of the audio output from the processor, and a blanking pulse generation component (10) for generating a blanking pulse signal (18) in relation to an impulse noise signal imposed on the radio frequency signal. The improvement (20) can include at least one detector (30a, 30b) for determining a state value of the blanking pulse signal, such as the pulse density or frequency. At least one alignment function module (32a, 32b) is provided that is operable on the state value to generate at least one corrected control value corresponding to one of the weak signal processing components. The corrected control value is fed to a decision module (34a, 34b) for comparing the corrected control value to the control value (36a, 36b) generated by a corresponding one of the weak signal processing components. The decision module (34a, 34b) then selects the control value that will have the greatest impact on the impulse noise reduction, and then provides that selected control values (40a, 40b) to the audio processor for controlling characteristics of the audio output from the processor.

20 Claims, 2 Drawing Sheets

WEAK SIGNAL PROCESSING BASED ON IMPULSE NOISE BLANKING

TECHNICAL FIELD

The invention relates generally to an audio noise reduction or suppression system, and more particularly to a system and method for reducing audio noise using impulse noise blanking techniques and traditional weak signal processing handles.

BACKGROUND OF THE INVENTION

Radio audio signals, whether frequency modulated (FM) stereo or amplitude modulated (AM), are often plagued with background noise caused by, among other things, disruption of the radio signal or electromagnetic interference from external sources. In an automotive FM/AM receiver, the environment is rife with sources of electromagnetic signals that fall within both the AM and the FM band.

One source of these signals is the ignition system of the vehicle. The electric spark used to ignite the fuel/air mixture, as well as the current flowing in the cables from the power source to the spark plugs, generate electrical interference which is picked up by the vehicle's FM/AM radio receiver. Interference generated by the ignition system is commonly categorized as impulse noise and causes a "popping" sound from the automotive speakers. In addition to the ignition impulse noise, automotive radio receivers are susceptible to interference created by various electrical motors of the vehicle, such as power window DC motors. In the typical case, this noise is a nuisance, but greater interference can render the radio unusable.

Traditionally, automotive FM/AM receivers have been provided with weak signal processing handles or functions, such as stereo flat blend, stereo high blend, high-frequency roll-off and audio attenuation. Tile general purpose of these functions is to reduce noise and distortion caused by multipath fading, adjacent channels and momentary loss of signal. The controls for these functions are typically derived from the Received Signal Strength Index (RSSI), ultra-sonic noise (USN), noise within the demodulated composite signal above all audio information, and wide-band amplitude modulation (WBAM). An audio processor block accepts these controls and determines the correct amount of audio processing functions to apply.

Among the weak signal processing functions, audio attenuation is, as the name implies, a gain stage controlled by the audio processor that acts upon the left and right audio channels. This is typically used at very weak signal levels after all other audio processing functions have been used. Audio attenuation is typically a last resort to quiet the noise by quieting all of the audible frequencies.

High-frequency roll-off, or high-cut, utilizes a low-pass filter with a corner frequency controlled by the audio processor. When activated, high-cut deliberately limits the bandwidth of the audio signal to attenuate noise in the high frequency range of the audio spectrum. High-cut weak signal processing is applied to the left and right audio paths.

Flat blend is the attenuation of the L-R stereo portion of the received signal. Because the noise spectrum of the demodulated FM signal increases as the square of the frequency, the noise content in the stereo portion of the signal is much greater than the mono. Therefore, blending to mono is advantageous when there is a significant amount of noise. Theoretically, a 26 dB improvement can be obtained with the flat blend entirely at mono. A substantial reduction in noise can still be attained by blending to less than full mono, leaving some stereo audio component.

High-blend weak signal processing is essentially high-cut applied on the stereo L-R path. The goal of high-blend is to have the same effect on the stereo noise as flat blend, but maintain stereo separation at lower frequencies. Since stereo separation is not very perceivable at higher frequencies, using high-frequency roll-off on the stereo path will reduce noise with little noticeable loss in stereo separation.

In order to account for impulse noise, many audio processors include a noise blanker. The concept behind the noise blanker is to detect the impulse and then appropriately blank the audio in relation to the disturbance. In one approach, the received signal is blanked in timing with the firing of the engine spark plugs, as described in U.S. Pat. No. 5,890,059, which disclosure is incorporated herein by reference. Another approach is a blanking circuit 10 depicted in FIG. 1. In this approach, the composite signal 11 is fed through two paths. In the first path, the signal passes through a delay 12 that delays passage of the signal for a predetermined length of time calibrated to the passage of the signal through the other path. Following the delay 12, the incoming composite signal is fed to a signal hold section 13.

In the second path, the incoming signal 11 passes through a high pass filter 15 that filters off all of the composite signal (FM or AM), leaving the ultra-sonic noise (USN). The filtered signal is fed to a comparator 16 which compares the USN to a threshold value 17. If the USN signal from the high pass filter 15 exceeds the threshold value, then the output of the comparator 16 goes high and a blanking pulse 18 is created. This blanking pulse 18 is fed to the signal hold section 13 which holds the signal fed to the output 14 at the value of the signal immediately before the impulse occurred. The delay 12 is calibrated to compensate for the delay as the signal 11 passes through the filter 15 and comparator 16.

The blanking circuit 10 in FIG. 1 can have many forms, such as a simple hold or a linear interpolation. However configured, the circuit holds the output signal 14 at something that better represents what the composite signal should be in the absence of the impulse noise. However, blanking circuits of this type are susceptible to distortion in the audio, especially for impulse rates of 1 kHz or higher, which typically corresponds to DC motor noise. Thus, there remains a need for an improved blanking approach that eliminates this unwanted distortion, while also eliminating the unwanted impulse noise.

SUMMARY OF THE INVENTION

It is an object of the present invention to address this need in a system for reducing noise in a received radio signal. One embodiment of the invention provides an improvement to a radio frequency audio processor having one or more weak signal processing components for generating one or more corresponding control values for controlling characteristics of the audio output from the processor, and a blanking pulse generation component for generating a blanking pulse signal in relation to an impulse noise signal imposed on the radio frequency signal. The improvement can comprise at least one detector for determining a state value of the blanking pulse signal, at least one alignment function module operable on the state value to generate at least one corrected control value corresponding to one of the weak signal processing components, and a decision module for comparing the at least one corrected control value to the control value generated by a corresponding one of the weak signal processing components and selecting one of the corrected control value or the control value to be provided to the audio processor for controlling characteristics of the audio output from the processor.

In one embodiment, the state value is the frequency of the blanking pulse signal and the at least one detector is an average detector operable to produce a state value indicative of the frequency of the blanking pulse signal. The average detector can include a single-pole high pass filter having a pre-determined time constant.

In a further aspect, the at least one alignment function module can apply an alignment algorithm to the state value to generate the at least one corrected control value. The alignment algorithm can include a number of predetermined coefficients and can implement a linear function of the state value, with the number of predetermined coefficients including slope and intercept coefficients. In certain embodiments, the improvement can include two alignment function modules corresponding to two different weak signal processing components. In this instance, each alignment function module can operate on the state value to generate a corrected control value corresponding to its corresponding weak signal processing components. The two alignment function modules can implement different alignment algorithms in which each is linear function of a corresponding state value, each liner function having different pre-determined slope and intercept coefficients.

In another aspect of the invention, a method for improved impulse noise reduction is provided for a radio frequency audio processor having one or more weak signal processing components for generating one or more corresponding control values for controlling characteristics of the audio output from the processor, and a blanking pulse generation component for generating a blanking pulse signal in relation to an impulse noise signal imposed on the radio frequency signal. The method can comprise the steps of determining a state value of the blanking pulse signal, generating, from the state value, at least one corrected control value corresponding to one of the weak signal processing components, and comparing the at least one corrected control value to the control value generated by a corresponding one of the weak signal processing components and selecting one of the corrected control value or the control value to be provided to the audio processor for controlling characteristics of the audio output from the processor.

One benefit of the improvement of the present invention is that it effectively treats impulse noise from the audio signal representation of the incoming radio signal. Another benefit is that the resulting audio signal is of significantly higher quality than can be produced simply by traditional noise blanking or weak signal processing techniques.

BRIEF DESCRIPTION OF THE FIGURES

The present invention will now be described, by way of example, with reference to the accompanying drawings, in which.

DESCRIPTION OF THE PREFERRED EMBODIMENT

Figure 1:
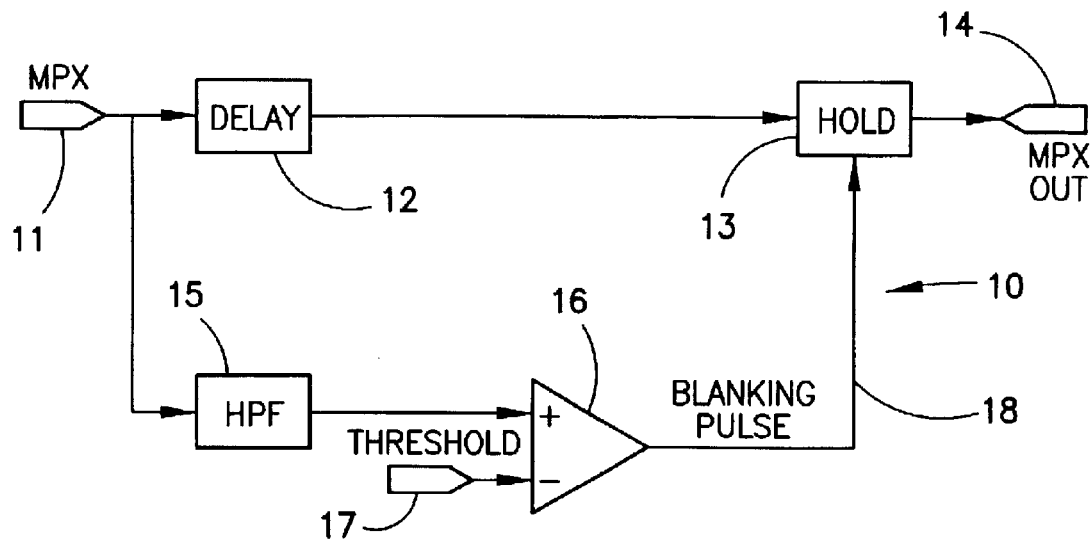
FIG. 1 is a schematic representation of a blanking circuit of the prior art.
Figure 2:
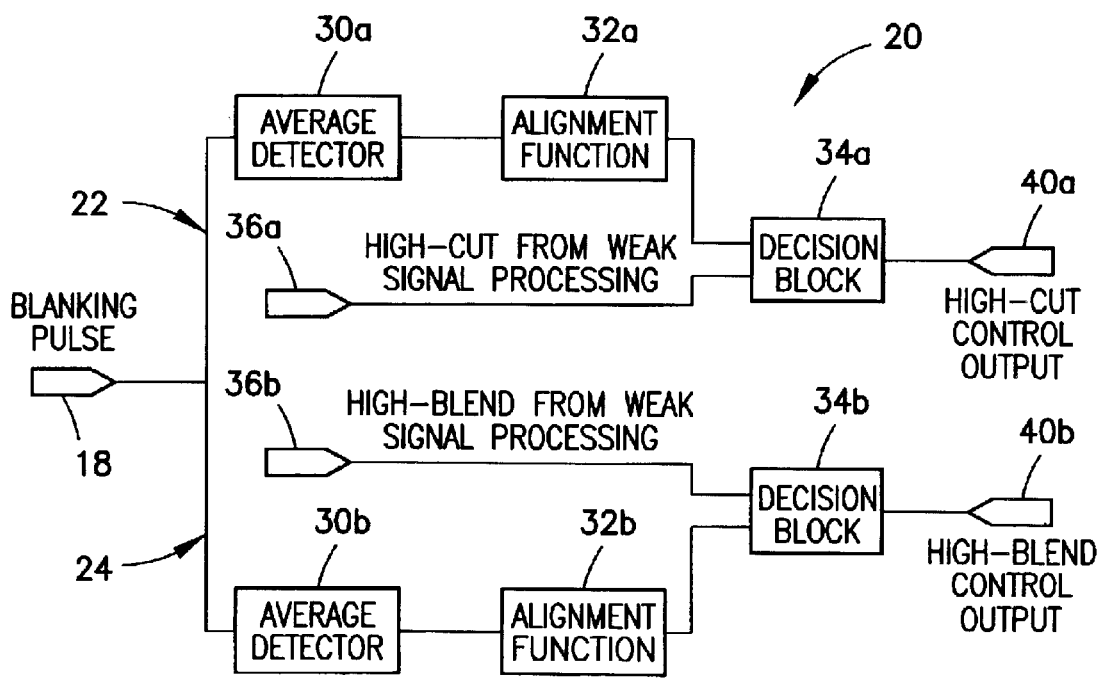
FIG. 2 is a schematic representation of a noise blanking system in accordance with one embodiment of the present invention.

In accordance with one embodiment of the invention, the blanking pulse 18 generated by a noise blanking circuit, such as the noise blanking circuit 10, is provided as an input to a corrected weak signal processing system 20. The blanking pulse 18 can be fed to multiple parallel paths, namely paths 22 and 24 in the illustrated embodiment. In accordance with one feature of the invention, each path can correspond to a weak signal processing control, such as the high cut, high blend, audio attenuation, flat blend, etc. In the embodiment illustrated in FIG. 2, the two paths correspond to high cut processing (path 22) and high blend processing (path 24).

In each path, the blanking pulse is fed to a corresponding average detector 30a, 30b that assesses a state value of the blanking pulse. In the preferred embodiment, this state value is the relevant density of the blanking pulse. The average detector for each processing path can constitute a 1-pole low-pass filter having a time constant that can be selected for the particular weak signal processing being applied. In the illustrated embodiment, both average detectors can have a time constant of about 100 ms, based upon the specifics of the audio processing system and the type of impulse noise being blanked. The output of each average detector is fed to an appropriate alignment function module 32a, 32b. The alignment function module is configured to establish how much the blanking pulse density affects each corresponding weak signal control. As is known in the field of FM noise reduction, the weak signal controls are typically coefficients that are applied to a filter that operates on the incoming radio signal, or on the audio path(s).

The alignment function modules 32a, 32b generate a signal, or control value, appropriate for the particular weak signal control. In accordance with one embodiment of the invention, the alignment function modules 32a, 32b modules provide a linear translation of the signal received from the corresponding average detectors 30a, 30b. In other words, the output of the alignment function modules can be in the form of Ax+b, where X is the magnitude of the signal generated by the average detector. In one embodiment, that magnitude corresponds to the blanking pulse density within the calibration of the average detector.

In accordance with a further feature of the invention, the alignment function modules 32a, 32b have adjustable slope (a) and intercept (b) values. For example, the processing path 22 generates a high cut weak signal control value, useful for addressing ignition generated noise, which yields a maximum high cut coefficient at an impulse noise of 2 kHz and begins application of high cut noise reduction at a pulse rate of between 500 Hz and 1 kHz. On the other hand, the processing path 24 can generate a high blend value, useful for addressing both DC motor and ignition noise, that is applied at a pulse rate of between 200–500 Hz and reaches a maximum value at a pulse rate of about 1.5 kHz.

The output from the alignment function modules 32a, 32b is provided to a respective decision module 34a, 34b. In addition to the alignment function signal, each decision module receives a signal from the conventional weak signal processing components of the radio receiver. For instance, in the illustrated embodiment, a high cut signal 36*a* and high blend signal 36*b* is received from corresponding processing component. These weak signal processing components operate in a known manner to derive the corresponding weak signal control signals from the RSSI, USN, WBAM, etc. The decision modules 34*a*, 34*b* evaluate the two weak signal processing control signals, one generated by the existing weak signal processing components and the other generated by the alignment function modules 32*a*, 32*b* of the present invention.

In accordance with one aspect of the invention, the decision module 34*a*, 34*b* can be programmed to choose whichever of the two signals supplied to the modules has the more dominant control over the noise reduction function of the system 20. The selected signal is then provided to the appropriate audio processing control as an output signal 40*a*, 40*b*. In a specific example, the high cut output is a coefficient provided to a filter, where the coefficient ranges from a value of 0 (zero) for a maximum bandwidth of the high cut filter and a value of 1 (one) for a minimum bandwidth of the high cut filter. Since a smaller bandwidth is desirable to eliminate the impulse noise, the decision module will select the one of the traditional high cut value or the value generated by the alignment function module 32*a* that has the greatest magnitude. The resulting output 40*a* will then be provided to the audio processing components. Alternatively, if the high cut filter bandwidth widens as the high cut control is increased, then the decision module 34*a* will select the smaller of the two input signals to the module.

It should be appreciated that the decision blocks 34*a*, 34*b* can be implemented in a variety of manners to decide whether to use the control value(s) generated by the traditional weak signal processing, or the control value(s) produced by the alignment function modules of the present invention. One factor considered in the design of the decision blocks is nature of the control values for the particular weak signal processing element. For instance, as reflected above, the high cut control value can determine the bandwidth of a high cut filter. Alternatively, if the weak signal processing element is the audio attenuation, the control signal may represent a gain stage coefficient for the audio processor. In this case, the associated decision block may be programmed to select the control signal that produces the greatest reduction in gain.

Figure 3:
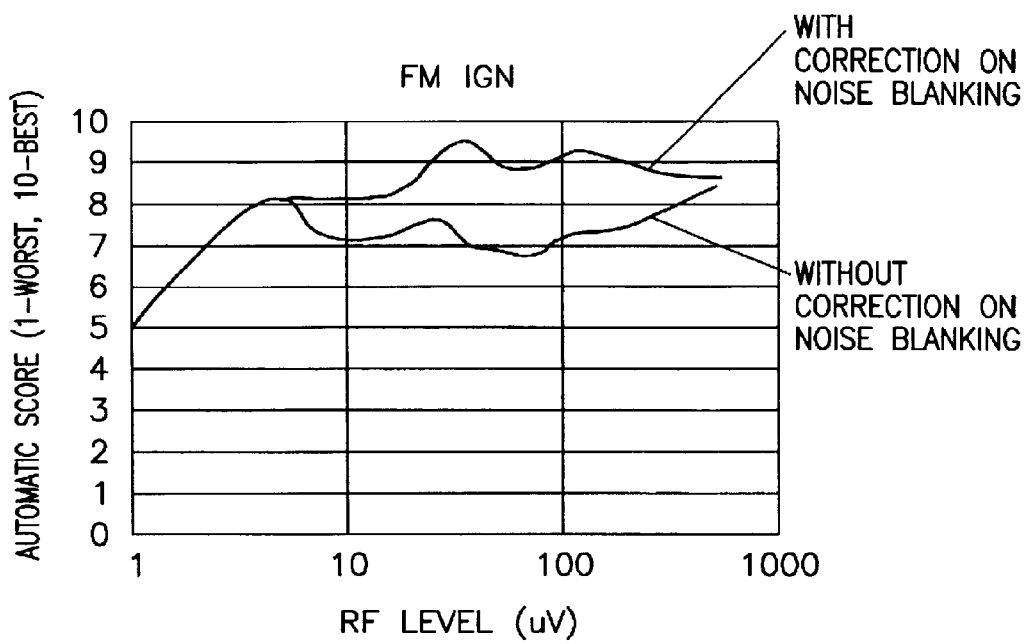
FIG. 3 is a graph depicting a comparison in output audio signal quality between an output signal generated by a blanking circuit of the type shown in FIG. 1 with traditional weak signal processing and an output signal generated by a noise blanking system of one embodiment of the present invention, based upon impulse noise generated by an automotive ignition circuit.
Figure 4:
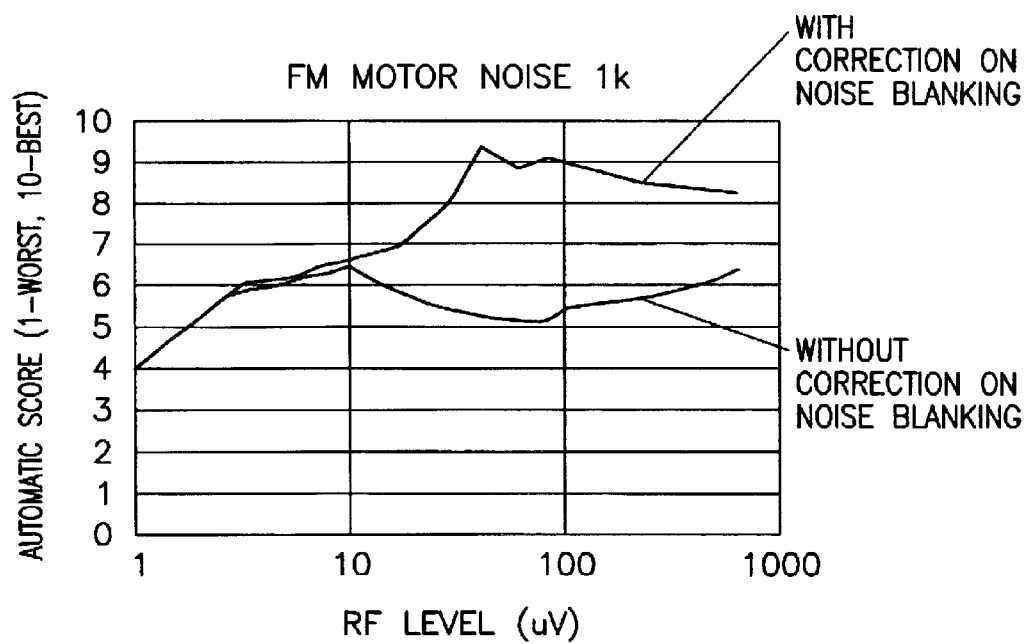
FIG. 4 is a graph depicting a comparison in output audio signal quality between an output signal generated by a blanking circuit of the type shown in FIG. 1 with traditional weak signal processing and an output signal generated by a noise blanking system of one embodiment of the present invention, based upon impulse noise generated by a DC motor for an automotive component.

The effect of one application of the invention to a proprietary audio processor is shown in FIGS. 3–4. The first graph in FIG. 3 concerns the improvement in sound quality when the RF signal carries vehicle ignition noise. The second graph of FIG. 4 illustrates the ability to overcome the effects of DC motor noise on the RF signal. The RF signal level (in microvolts) is along the abscissa, while the ordinate represents an audio quality score. As both graphs demonstrate, the audio quality improves at RF levels of about 10 microvolts and above when correction is applied to the noise blanking in accordance with the present invention.

The corrected weak signal processing system 20 can be implemented through software within the digital signal processing components of an existing audio processor. The blanking pulse 18 output from the comparator 16 can be a digital signal that can be fed to digital average detectors, such as the detectors 30*a*, 30*b*. The average detectors can be configured to produce a value representative of the impulse density, calibrated by the time constant of the detectors. The alignment function modules 32*a*, 32*b* and decision modules 34*a*, 34*b* can be in the form of assembly language or DSP program statements that perform the respective calculations and comparisons. It can be appreciated that the form of the alignment functions in the modules 32*a*, 32*b* can be such that these modules produce a decision in their own right— i.e., whether or not to apply the particular corrected weak signal control. In the example described above, this decision point is represented by the intercept value for the linear relationship—i.e., until the pulse density reaches the appointed intercept frequency, the alignment function will not generate a nonzero control output value. In addition, as can be appreciated from the above example, the system 20 contemplates that no corrected weak signal processing control signal will be generated, or only one such signal, or multiple signals when the blanking pulse 18 meets the requirements of more than one alignment function.

In the first instance, the average detectors 30*a*, 30*b* can also provide an initial decision point, namely whether and when to apply one of the particular weak signal processing handles. For instance, a particular average detector can be calibrated (such as by modifying its time constant) so that it only registers impulse frequencies above a certain value, while another average detector can be calibrated to operate only on impulse noise having a higher frequency.

It is understood that a corrected weak signal processing system 20 can operate on many weak signal processing handles and can include more than just two signal paths 22, 24. For instance, additional paths, including corresponding average detectors, alignment function modules and decision modules can be added for audio attenuation and flat blend controls. In addition, a single alignment function module can be utilized, provided each of the operating weak signal processing handles rely upon the same form of alignment function. In this case, to the extent that the common alignment function can be adapted to a specific processing handle by proper selection of coefficient(s), then the alignment function module can extract the appropriate coefficient(s) based upon the signal from the average detector. Likewise, the function of multiple decision modules 34*a*, 34*b* can be integrated into a common decision module. In this case, the common decision module would need to receive inputs from multiple traditional weak signal processing components and be provided with means for differentiating among the multiple inputs. The common decision module could then include multiple outputs to provide control signals to the appropriate weak signal processing component within the audio processor.

The foregoing description related primarily to an FM signal processing system. However, it should be apparent that the same components can be implemented for impulse noise reduction in an AM signal processing system.

What is claimed is:

1. In a radio frequency audio processor having one or more weak signal processing components for generating one or more corresponding control values for controlling characteristics of the audio output from the processor, and a blanking pulse generation component for generating a blanking pulse signal in relation to an impulse noise signal imposed on the radio frequency signal, the improvement comprising:

at least one detector for determining a state value of the blanking pulse signal;

at least one alignment function module operable on the state value to generate at least one corrected control value corresponding to one of the weak signal processing components; and a decision module for comparing said at least one corrected control value to the control value generated by a corresponding one of the weak signal processing components and selecting one of said corrected control value or the control value to be provided to the audio processor for controlling characteristics of the audio output from the processor.

2. The improvement according to claim 1, wherein the state value is the frequency of the blanking pulse signal and said at least one detector is an average detector operable to produce a state value indicative of the frequency of the blanking pulse signal.

3. The improvement according to claim 2, wherein said average detector includes a single-pole low pass filter having a pre-determined time constant.

4. The improvement according to claim 1, wherein the at least one alignment function module applies an alignment algorithm to the state value to generate said at least one corrected control value.

5. The improvement according to claim 4, wherein said alignment algorithm includes a number of pre-determined coefficients.

6. The improvement according to claim 5, wherein said alignment algorithm is a linear function of the state value and the number of predetermined coefficients includes slope and intercept coefficients.

7. The improvement according to claim 1, wherein said at least one alignment function module includes two alignment function modules operable on the state value to generate two corrected control values corresponding to two of the weak signal processing components.

8. The improvement according to claim 7, wherein each of the two alignment function modules applies a corresponding alignment algorithm to the state value to generate said two corrected control values.

9. The improvement according to claim 8, wherein the two alignment function modules are different from each other.

10. The improvement according to claim 8, wherein each of the two alignment algorithms includes a number of pre-determined coefficients.

11. The improvement according to claim 10, wherein said alignment algorithm is a linear function of the state value and the number of pre-determined coefficients includes slope and intercept coefficients.

12. The improvement according to claim 10, wherein said number of pre-determined coefficients of the two alignment function modules are different from each other.

13. The improvement according to claim 7, wherein said at least one detector includes two detectors for determining a state value for a corresponding one of said two alignment function modules.

14. The improvement according to claim 13, wherein each of said two detectors is a single-pole low pass filter, each having a pre-determined time constant.

15. The improvement according to claim 14, wherein each of said two detectors has a different time constant.

16. In a radio frequency audio processor having one or more weak signal processing components for generating one or more corresponding control values for controlling characteristics of the audio output from the processor, and a blanking pulse generation component for generating a blanking pulse signal in relation to an impulse noise signal imposed on the radio frequency signal, a method for impulse noise reduction comprising:

determining a state value of the blanking pulse signal;

generating, from the state value, at least one corrected control value corresponding to one of the weak signal processing components; and comparing the at least one corrected control value to the control value generated by a corresponding one of the weak signal processing components and selecting one of the corrected control value or the control value to be provided to the audio processor for controlling characteristics of the audio output from the processor.

17. The method for impulse noise reduction according to claim 16, wherein the determining step includes determining the frequency of the blanking pulse signal as the state value.

18. The method for impulse noise reduction according to claim 16, wherein the generating step includes applying an algorithm to the state value to generate the corrected control value.

19. The method for impulse noise reduction according to claim 16, wherein the generating step includes generating two corrected control values corresponding to two different weak signal processing components.

20. The method for impulse noise reduction according to claim 19, wherein the generating step includes applying a linear algorithm to generate each of the two corrected control values.

* * * * *